United States Patent
Hu et al.

(10) Patent No.: US 9,564,391 B2
(45) Date of Patent: Feb. 7, 2017

(54) THERMAL ENHANCED PACKAGE USING EMBEDDED SUBSTRATE

(75) Inventors: Kevin (Kunzhong) Hu, Irvine, CA (US); Edward Law, Ladera Ranch, CA (US)

(73) Assignee: Broadcom Corporation, Irvine, CA (US)

( * ) Notice: Subject to any disclaimer, the term of this patent is extended or adjusted under 35 U.S.C. 154(b) by 1060 days.

(21) Appl. No.: 13/030,470

(22) Filed: Feb. 18, 2011

(65) Prior Publication Data

US 2012/0175773 A1 Jul. 12, 2012

Related U.S. Application Data

(60) Provisional application No. 61/430,253, filed on Jan. 6, 2011.

(51) Int. Cl.
*H01L 23/498* (2006.01)
*H01L 23/36* (2006.01)
*H01L 23/538* (2006.01)
*H01L 23/00* (2006.01)

(52) U.S. Cl.
CPC ......... *H01L 23/49816* (2013.01); *H01L 23/36* (2013.01); *H01L 23/5389* (2013.01); *H01L 24/19* (2013.01); *H01L 2224/12105* (2013.01); *H01L 2224/32245* (2013.01); *H01L 2224/73267* (2013.01); *H01L 2224/92244* (2013.01); *H01L 2924/01029* (2013.01); *H01L 2924/14* (2013.01); *H01L 2924/181* (2013.01)

(58) Field of Classification Search
USPC .................... 257/734–786, E23.02, E23.021, E23.033,257/E23.035, E23.06
See application file for complete search history.

(56) References Cited

U.S. PATENT DOCUMENTS

| | | | |
|---|---|---|---|
| 2002/0195721 A1* | 12/2002 | Lee et al. ...................... | 257/780 |
| 2003/0003706 A1* | 1/2003 | Suzuki .......................... | 438/613 |
| 2005/0121765 A1* | 6/2005 | Lin ................................ | 257/686 |
| 2005/0258537 A1* | 11/2005 | Huang et al. ................. | 257/738 |

* cited by examiner

*Primary Examiner* — Tucker J Wright
(74) *Attorney, Agent, or Firm* — Sterne, Kessler, Goldstein & Fox PLLC

(57) ABSTRACT

An integrated circuit (IC) device is provided. The IC device includes an IC die having opposing first and second surfaces, a carrier coupled to the first surface of the IC die, a laminate coupled to the carrier and the second surface of the IC die, and a trace located on a surface of the laminate and electrically coupled to a bond pad located on the second surface of the IC die. The trace is configured to couple the bond pad to a circuit board.

20 Claims, 12 Drawing Sheets

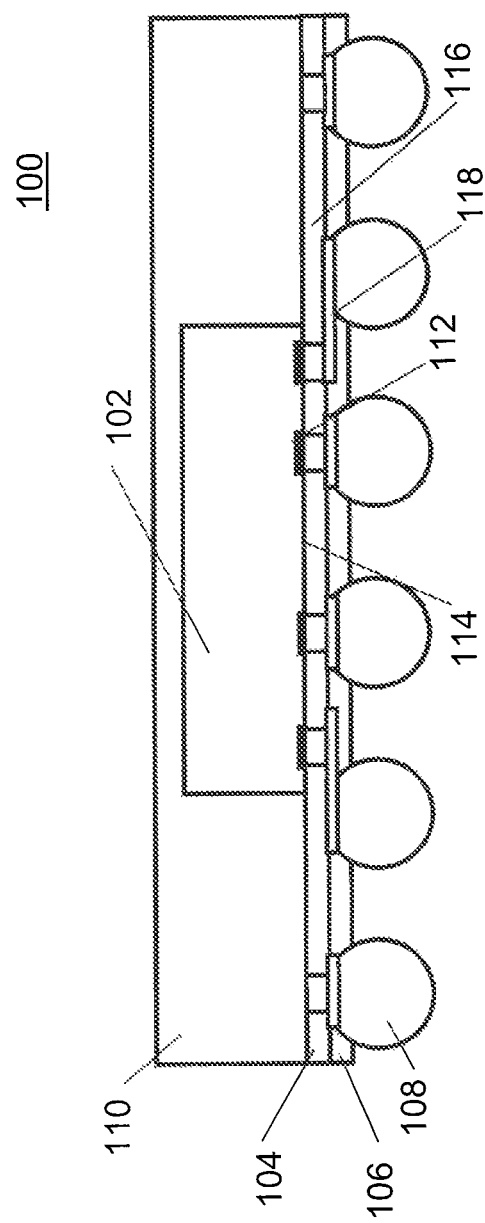
FIG. 1
Conventional

THERMAL ENHANCED PACKAGE USING EMBEDDED SUBSTRATE

CROSS REFERENCE TO RELATED APPLICATIONS

This application claims the benefit of U.S. Provisional Appl. No. 61/430,253, filed Jan. 6, 2011, which is incorporated by reference herein in its entirety.

BACKGROUND

Field

The present invention generally relates to integrated circuit (IC) devices. Specifically, the present invention relates to array-type IC devices.

Background

Integrated circuit (IC) devices typically include an IC die and a package that houses the IC die. The package protects the IC die, e.g., during handling of the IC device, and can facilitate connections to other devices. In some conventional array-type IC devices, the IC device includes an IC die coupled to a substrate. The substrate routes bond pads on the IC die to an array of connection elements coupled to the substrate (e.g., solder balls in a ball grid array device). These conventional IC devices can have a number of drawbacks. For example, the substrate can increase the thickness of the IC device and the length of the traces in the substrate can lead to interference from induced voltages.

In another type of IC device, the IC die is coupled to a redistribution layer (RDL) that routes the bond pads of the IC die to connection elements coupled to the RDL. In these devices, a mold compound or encapsulate may be used to protect the IC die. The molding compound used for wafer molding, however, can be an expensive material. Moreover, the molding process can also be costly and lengthy.

BRIEF SUMMARY

In one embodiment, an integrated circuit (IC) device is provided. The IC device includes an IC die having opposing first and second surfaces, a carrier coupled to the first surface of the IC die, a laminate coupled to the carrier and the second surface of the IC die, and a trace located on a surface of the laminate and electrically coupled to a bond pad located on the second surface of the IC die. The trace is configured to couple the bond pad to a circuit board.

In another embodiment, a method of manufacturing an IC device is provided. The method includes coupling a first surface of an IC die to a carrier, coupling a first laminate to a carrier, covering a second surface of the IC die with a second laminate, and forming a trace on a surface of the second laminate. The first laminate has an opening configured to accommodate the IC die. The second surface of the IC die opposes the first surface of the IC die. The trace is electrically coupled to a bond pad located on the second surface of the IC die. The trace is configured to couple the bond pad to a circuit board.

These and other advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, farther serve to explain the principles of the invention and to enable a person skilled in the pertinent art to make and use the invention.

FIG. 1 shows a cross-sectional diagram of an IC device.

Figure 2:
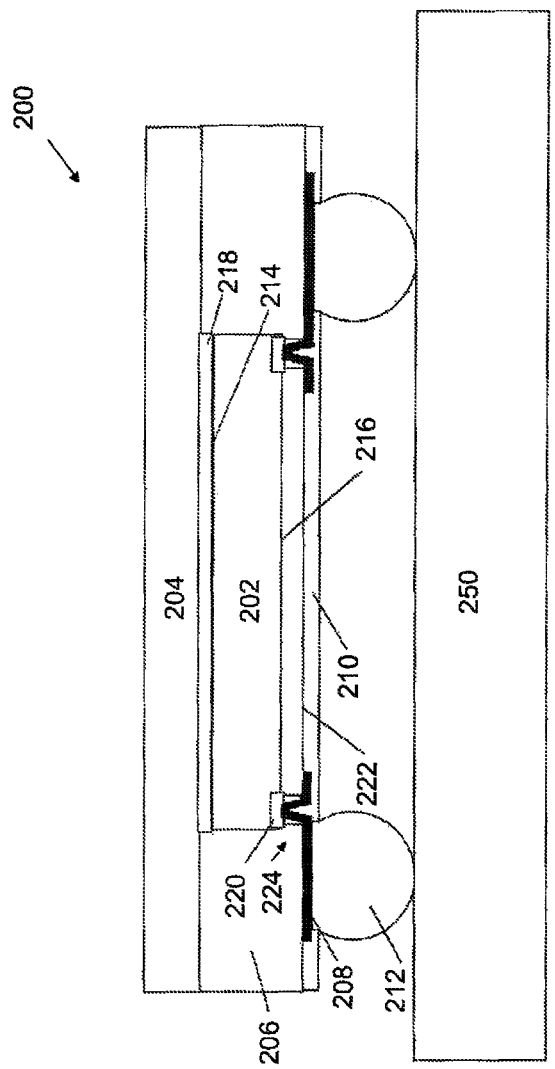
FIG. 2 shows a cross-sectional diagram of an IC device, according to an embodiment of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

FIG. 1 shows a cross-sectional diagram of a conventional fan-out integrated circuit (IC) package 100. IC device 100 includes an IC die 102, a redistribution layer (RDL) 104, a solder mask 106, solder balls 108, and a mold 110. Bond pads 112 of IC die 102 are located on a surface 114 of IC die 102. RDL 104 includes a dielectric layer 116 and traces 118.

Bond pads 112 couple IC die 102 to solder balls 108. Specifically, each one of bond pads 112 is coupled to a respective one of traces 118 and each of traces 118 is coupled to a respective one of solder balls 108. When IC device 100 is mounted on a circuit board (not shown in FIG.

1), solder balls 108 can be used to electrically couple IC die 102 to other devices mounted on the circuit board.

IC die 102 is molded with mold 110. Mold 110 can be used to hold multiple IC dies in a wafer format or to protect IC die 102 (and the other components of IC device 100), e.g., so that IC package 100 is not damaged during handling after singulation. But molded devices, such as IC device 100, have drawbacks. For example, mold 110 itself can be an expensive material and the molding process used to generate mold 110 can be an expensive process that requires specialized molding equipment. Moreover, the molded reconstitution wafer needs to go through a wafer level redistribution layer (RDL) process and a bumping process. The overall cycle time for manufacturing processes that include a molding process can be very long, e.g., 4-6 weeks.

In embodiments described herein, an IC device is provided that includes a die embedded in lamination material coupled to a carrier through a die attach film, die attach epoxy, or something similar. The laminate can protect the components of the IC device without having to use a costly molding process involving the use of specialized molding equipment and specialized molding material. The lamination material will hold the die in a laminate substrate or a panel format so that existing laminate substrate processing equipment can be used for the subsequent processes. Thus, the RDL and bumping processes and the equipment related to these processes can be eliminated. Laminate materials also generally have predictable high reliability. Thus, IC devices described herein can have at least the same reliability as IC devices manufactured using the more costly molding process. The IC devices can also include traces on a surface of the laminate that couple the IC die's bond pads to connection elements (e.g., solder balls).

Moreover, IC devices described herein allow for bond pads on an IC die to be routed to connection elements without the use of an extra substrate. Doing so can make the IC device substantially thinner and can lead to traces having lower inductance. Moreover, by eliminating the use of a substrate, manufacturing processes used to couple the IC die to the substrate can be eliminated (e.g., a flip chip attach process or a wirebonding process).

FIG. 2 shows a cross-sectional diagram of an IC device 200, according to an embodiment of the present invention. IC package 200 includes an IC die 202, a carrier 204, a laminate 206, traces 208, a solder mask 210, and connection elements 212.

As shown in FIG. 2, IC die 202 has first and second surfaces 214 and 216. Bond pads 220 are located on second surface 216 of IC die 202. Bond pads 220 can be distributed at any locations on second surface 216 of IC die 202. IC die 202 can include a variety of circuits. These circuits can use bond pads 216 to communicate with devices outside of IC device 200.

Each one of bond pads 220 is coupled to a respective one of traces 208 through a respective one of vias 224. Traces 208 and vias 224 can be formed out of an electrically conductive material (e.g., copper, nickel, gold, etc.). Solder mask 210 is formed on laminate 206. Solder mask 210 is configured to expose portions of traces 208. These exposed portions of traces 208 are coupled to connection elements 212. In the embodiment of FIG. 2, connection elements 212 are solder balls. Connection elements 212 can be copper posts, pillar bumps, or the like.

IC device 200 is mounted to a circuit board 250. Through circuit board 250, bond pads 220 can be electrically coupled to other devices mounted on circuit board 250.

Laminate 206 is coupled carrier 204 and second surface 216 of IC die 202. Laminate 206 can be any one of a variety of laminate materials known to those skilled in the art (e.g., a fiber material, a substrate core material, a prepreg material, etc.). Similar to a mold, laminate 206 can be used to protect IC package 200. Unlike a mold, however, laminate 206 can be provided without using an expensive molding process. Furthermore, laminate 206 holds IC die 202 in a strip or panel format so that existing laminate substrate processing equipment can be used for the subsequent processes.

As will be further described below, laminate 206 can be formed through the use of a first laminate and a second laminate. The first laminate can have an opening that is configured to accommodate IC die 202. A second laminate is placed on the first laminate to cover IC die 202. The first and second laminates are then pressed and heated to form single, contiguous laminate 206 shown in FIG. 2.

An adhesive 218 attaches first surface 214 of IC die 202 to carrier 204. As would be appreciated by those skilled in the relevant art, carriers are often used as a platform when IC devices are manufactured. These carriers, however, are typically removed during the manufacturing process. In contrast, in the embodiment of FIG. 2, carrier 204 is not removed from IC device 200. Therefore, the manufacturing step in which the carrier is typically removed can be eliminated. Furthermore, carrier 204 can be formed out of a thermally conductive material (e.g., copper or aluminum). In that embodiment, carrier 204 can function as a heat spreader. In a further embodiment, adhesive 214 can be a thermally conductive adhesive to enhance the heat spreading that carrier 204 provides.

In contrast to IC device 100, which includes a mold to protect its components, IC device 200 includes a laminate that protects its components. As described above, laminate materials are generally cheaper than mold materials. Also, manufacturing processes for devices having laminates can have relatively short cycle times (e.g., about two weeks compared to 4-6 weeks for devices going through wafer molding, RDL, and bumping processes). Moreover, devices including a laminate instead of a mold can also be manufactured relatively cheaply because specialized equipment is not required for the molding process and the wafer level redistribution and bumping processes.

Figure 3:
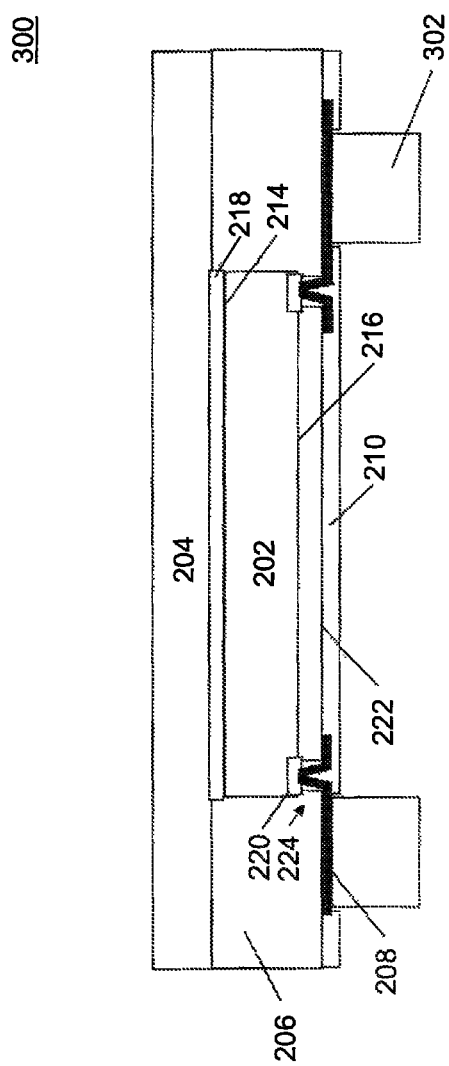
FIG. 3 shows a cross-sectional diagram of an IC device having solder paste as a connection element, according to an embodiment of the present invention.

FIG. 3 shows a cross-sectional view of an IC device 300, according to an embodiment of the present invention. IC device 300 is similar to IC device 200, except that connection elements 212 in IC device 200 are replaced with connection elements 302 in IC device 300. As shown in FIG. 3, connection elements 302 are solder paste applied to exposed portions of traces 208. Solder paste 302 can go through a reflow process to form solder balls. In alternate embodiments, other types of connection elements can be used instead of using preformed solder balls (as in the embodiment of FIG. 2) and solder paste printing (as in the embodiment of FIG. 3), e.g., pins can be used as connection elements.

Figure 4:
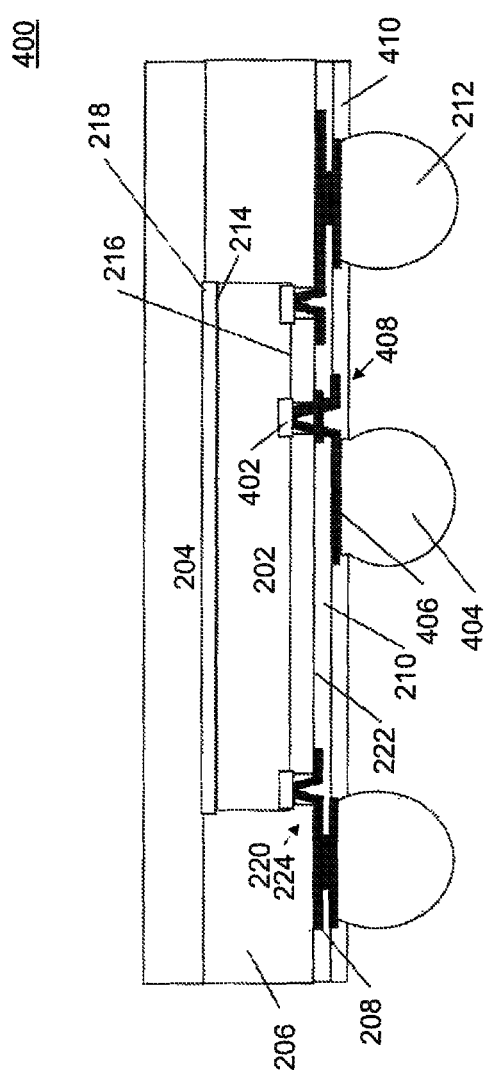
FIG. 4 shows a cross-sectional diagram of an IC device including multiple levels of traces, according to an embodiment of the present invention.

FIG. 4 shows a cross-sectional view of an IC device 400, according to an embodiment of the present invention. IC device 400 is similar to IC device 200, except that in IC device 400 multiple layers of traces are used to route bond pads of IC die 202 to respective connection elements.

IC device 400 includes second bond pads 402 that are coupled to second connection elements 404 through second traces 406. Specifically, second bond pads 402 are coupled to second traces 406 through second vias 408. A second solder mask 410 is formed on solder mask 210 and is configured to expose portions of second traces 406 and the portions of traces 208 exposed by solder mask 210. Second bond pads 402, second connection elements 404, second traces 406, second vias 408, and second solder mask 410 can be substantially similar to bond pads 220, connection elements 212, traces 208, vias 224, and solder mask 210, respectively.

Figure 5:
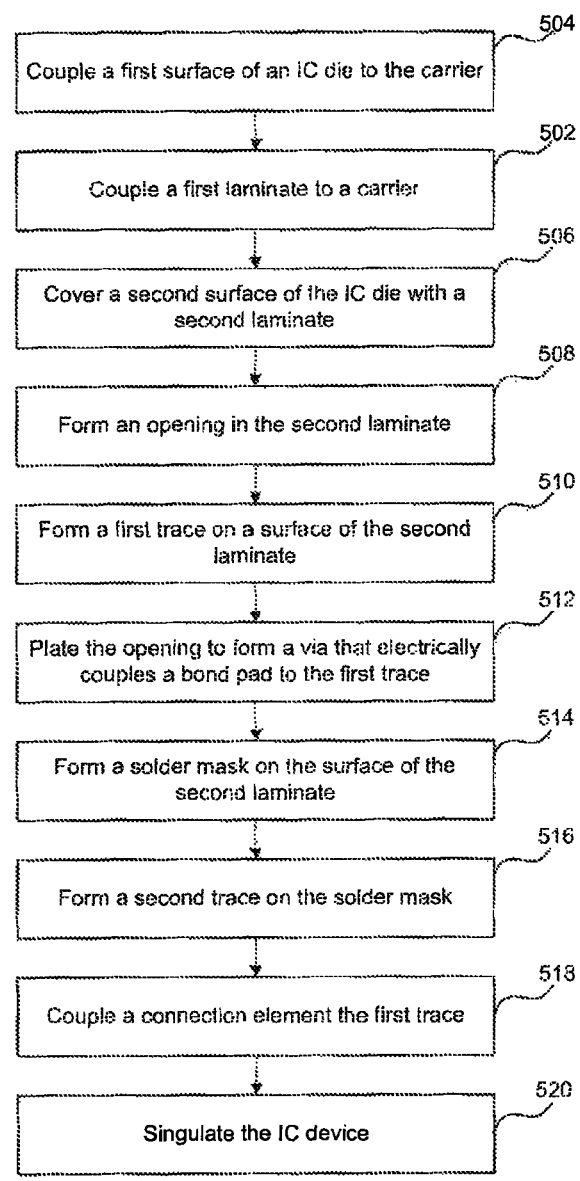
FIG. 5 shows a flowchart providing example steps for manufacturing an IC device, according to an embodiment of the present invention.

FIG. 5 shows a flowchart 500 providing example steps for manufacturing an IC device. Other structural and operational embodiments will be apparent to persons skilled in the relevant art(s) based on the following discussion. The steps shown in FIG. 5 do not necessarily have to occur in the order shown. The steps of FIG. 5 are described in detail below.

Figure 6:
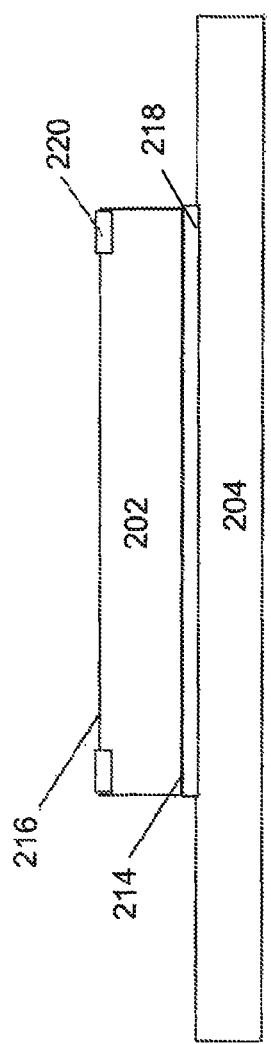
FIG. 6 shows a cross-sectional diagram of an IC device at a first stage of manufacture, according to an embodiment of the present invention.

In step 502, a first surface of an IC die is coupled to a carrier. For example, FIG. 6 shows an IC device 600 at a first stage of manufacture. As shown in FIG. 6, first surface of IC die 202 is coupled to carrier 204 using adhesive 218.

Figure 7:
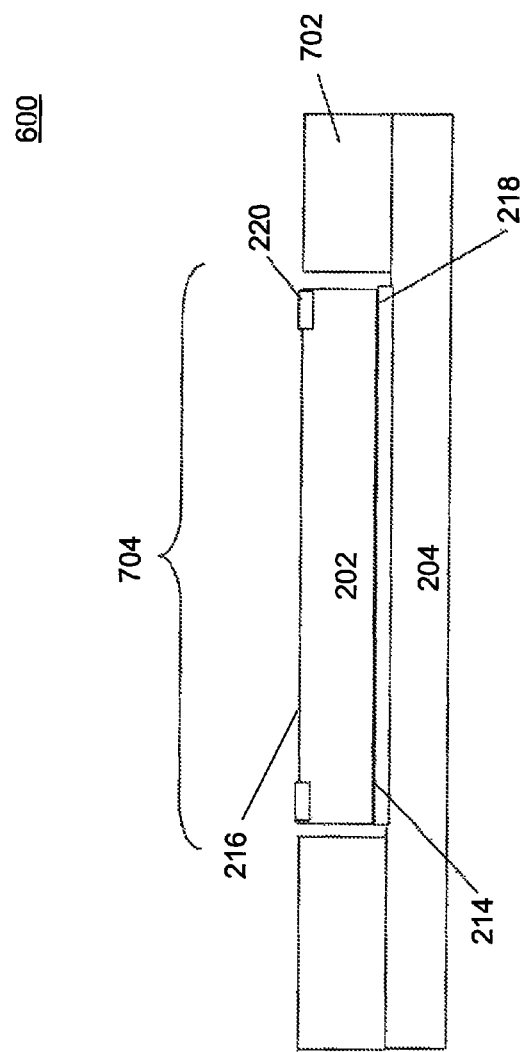
FIG. 7 shows a cross-sectional diagram of an IC device at a second stage of manufacture, according to an embodiment of the present invention.

In step 504, a first laminate is coupled to the carrier. For example, FIG. 7 shows IC device 600 at a second stage of manufacture. As shown in FIG. 7, a first laminate 702 is coupled to carrier 204. As shown in FIG. 7, laminate 702 includes an opening 704 that is configured to accommodate IC die 202.

Figure 8:
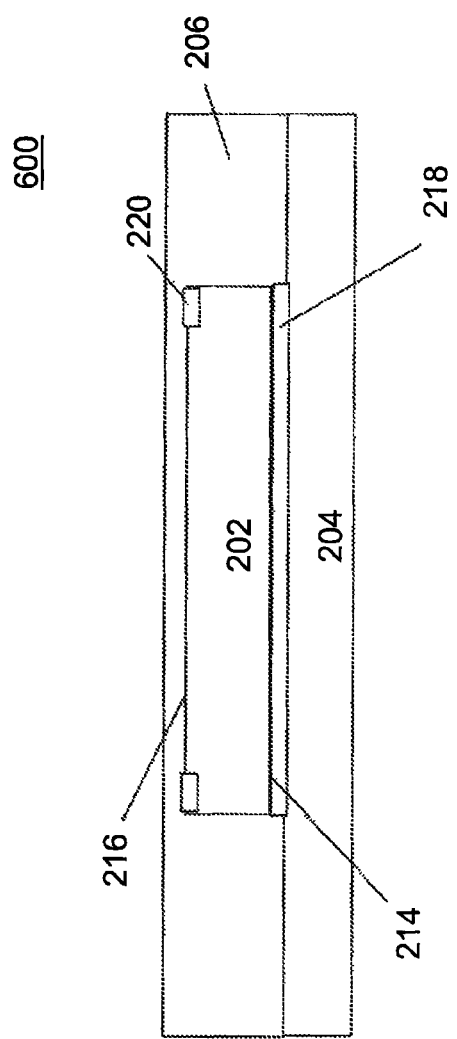
FIG. 8 shows a cross-sectional diagram of an IC device at a third stage of manufacture, according to an embodiment of the present invention.
Figure 9:
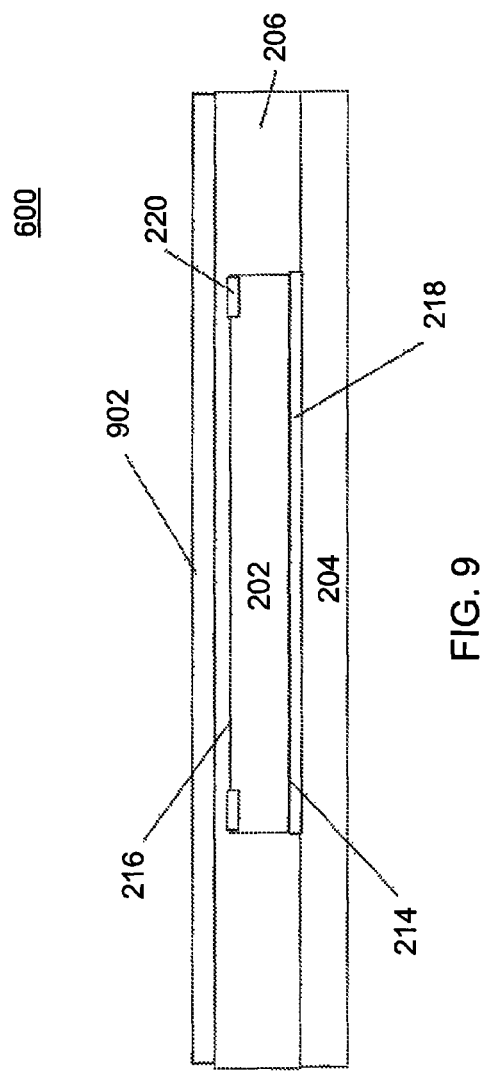
FIG. 9 shows a cross-sectional diagram of an IC device at a third stage of manufacture, according to an embodiment of the present invention.

In step 506, a second surface of the IC die is covered with a second laminate. For example, FIG. 8 shows IC device 600 at a third stage of manufacture. FIG. 8 shows IC device 600 after a second laminate was coupled to second surface 216 of IC die 202 and the first and second laminates were pressed and heated to form laminate 206. FIG. 9 shows another embodiment of IC device 600 at a third stage of manufacture. Unlike the embodiment of FIG. 8, in the embodiment of FIG. 9, laminate 206 comes with a copper foil 902 attached to it. Copper foil 902 can be etched to form traces.

Figure 10:
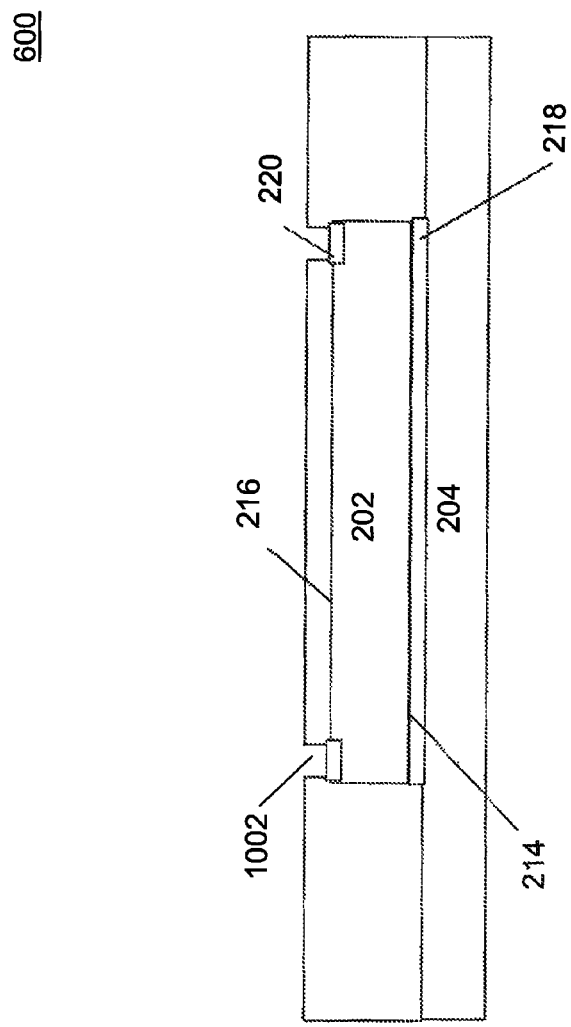
FIG. 10 shows a cross-sectional diagram of an IC device at a fourth stage of manufacture, according to an embodiment of the present invention.

In step 508, an opening is formed in the second laminate. For example, FIG. 10 shows IC device after a fourth stage of manufacture. As shown in FIG. 10, openings 1002 are formed in laminate 206. Openings 1002 expose bond pads 220.

Figure 11:
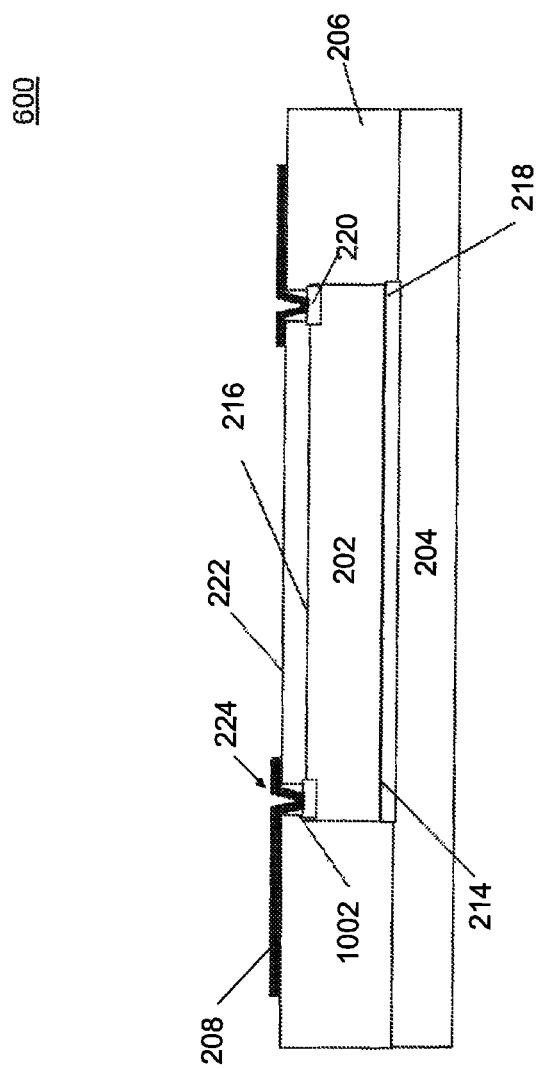
FIG. 11 shows a cross-sectional diagram of an IC device at a fifth stage of manufacture, according to an embodiment of the present invention.

In step 510, a first trace is formed on a surface of the second laminate. In step 512, the opening is plated to form a via that electrically couples a bond pad to the first trace. For example, FIG. 11 shows IC device 600 at a fifth stage of manufacture. As shown in FIG. 11, openings 1002 are plated to form vias 224. Moreover, traces 208 are formed on surface 222 of laminate 206. In an embodiment, traces 208 can be formed by etching a copper foil (e.g., copper foil 902 shown in FIG. 9). In another embodiment, traces 208 can be formed by plating surface 222 of laminate 206 with a patterned conductive material.

Figure 12:
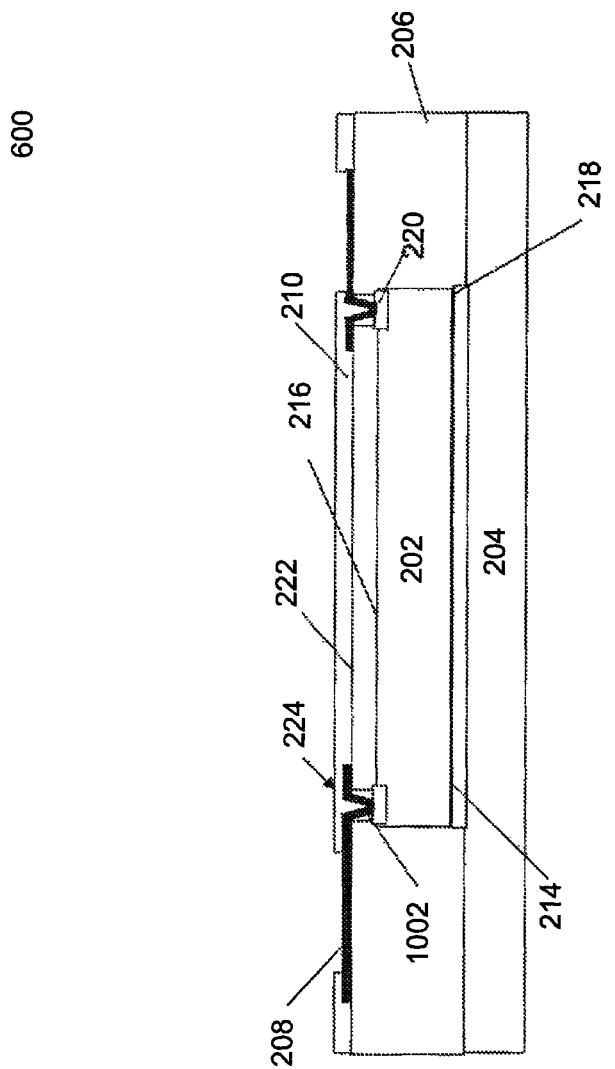
FIG. 12 shows a cross-sectional diagram of an IC device at a sixth stage of manufacture, according to an embodiment of the present invention.

In step 514, a solder mask is formed on the surface of the second laminate. For example, FIG. 12 shows IC device 600 at a sixth stage of manufacture. As shown in FIG. 12, solder mask 210 is formed on surface 222 of laminate 206. Solder mask 210 is configured to expose portions of traces 208.

In optional step 516, a second trace is formed on the solder mask. For example, FIG. 4 shows an embodiment in which second traces 406 are formed on solder mask 210. In such an embodiment, multiple layers can be used to route connections for bond pads of IC die 202.

In step 518, a connection element is coupled to the first trace. For example, in FIG. 2, connection elements 212 are coupled to traces 208. The connection elements can be preformed solder balls (as in the embodiment of FIG. 2), solder paste followed by reflow to form solder balls (as in the embodiment of FIG. 3), or other types of connection elements, e.g., pins.

In step 520, the IC device is singulated. For example, in a manufacturing process, multiple IC devices can be formed on the same carrier (e.g., carrier 204). These different IC devices are singulated by, for example, sawing them apart.

In another embodiment, an IC device can include multiple IC dies. In such an embodiment, step 520 can include sawing the carrier such that multiple IC dies are included in the same IC device.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An integrated circuit (IC) device, comprising:
   an IC die having opposing first and second surfaces;
   a carrier coupled to the first surface of the IC die;
   a laminate having opposing first and second surfaces, the first surface of the laminate directly contacting the carrier, wherein a third surface of the laminate directly contacts the second surface of the IC die; and
   a trace located on the second surface of the laminate and electrically coupled to a bond pad located on the second surface of the IC die, wherein the trace is configured to couple the bond pad to a circuit board.

2. The IC device of claim 1, farther comprising:
   a connection element coupled to the trace and configured to be coupled to the circuit board.

3. The IC device of claim 2, Wherein the connection element comprises at least one of a solder ball or a solder paste.

4. The IC device of claim 1, further comprising:
   a solder mask formed on the second surface of the laminate.

5. The IC device of claim 4, wherein the solder mask is configured to expose a portion of the trace.

6. The IC device of claim 4, further comprising:
   a second trace located on a surface of the solder mask, wherein the second trace is electrically coupled to a second bond pad located on the second surface of the IC die.

7. The IC device of claim 1, wherein the carrier comprises a thermally conductive material.

8. The IC device of claim 1, further comprising a via that couples the trace to the bond pad.

9. The IC device of claim 1, wherein the laminate is substantially uniform in composition.

10. The IC device of claim 9, wherein the trace is in direct contact with the second surface of the laminate.

11. The IC device of claim 1, wherein the laminate comprises a fiber material.

12. The IC device of claim 1, wherein the laminate comprises a substrate core material.

13. The IC device of claim 1, wherein the laminate comprises a prepreg material.

14. The IC device of claim 1, further comprising:
a first solder mask formed on the second surface of the laminate; and
a second solder mask formed on the first solder mask.

15. The IC device of claim 14, wherein the first solder mask is configured to expose a portion of the trace.

16. The IC device of claim 15, further comprising:
a second trace formed on the first solder mask.

17. The IC device of claim 16, wherein the trace is a first trace, further comprising:
a via that electrically couples the first trace to the second trace.

18. The IC device of claim 16, wherein the first trace is electrically coupled to a first bond pad of the IC die and the second trace is electrically coupled to a second bond pad of the IC die.

19. The IC device of claim 17, wherein the second solder mask is configured to expose at least a portion of the second trace.

20. The IC device of claim 1, further comprising an adhesive that couples the carrier to the IC die.

* * * * *

UNITED STATES PATENT AND TRADEMARK OFFICE
CERTIFICATE OF CORRECTION

PATENT NO. : 9,564,391 B2
APPLICATION NO. : 13/030470
DATED : February 7, 2017
INVENTOR(S) : Hu et al.

Page 1 of 1

It is certified that error appears in the above-identified patent and that said Letters Patent is hereby corrected as shown below:

In the Claims

Column 6, Line 46 replace "The IC device of claim 1, farther comprising" with -- The IC device of claim 1, further comprising --.

Column 6, Line 49 replace "The IC device of claim 2, Wherein the connection" with -- The IC device of claim 2, wherein the connection --.

Signed and Sealed this
Fourth Day of June, 2019

Andrei Iancu
*Director of the United States Patent and Trademark Office*